United States Patent
Park

(10) Patent No.: US 8,325,539 B2
(45) Date of Patent: Dec. 4, 2012

(54) SEMICONDUCTOR MEMORY DEVICE HAVING PHYSICALLY SHARED DATA PATH AND TEST DEVICE FOR THE SAME

(75) Inventor: Hwan-wook Park, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 206 days.

(21) Appl. No.: 12/773,177

(22) Filed: May 4, 2010

(65) Prior Publication Data
US 2010/0315887 A1 Dec. 16, 2010

(30) Foreign Application Priority Data
Jun. 11, 2009 (KR) .................. 10-2009-0051950

(51) Int. Cl.
*G11C 7/06* (2006.01)
(52) U.S. Cl. ............... 365/189.07; 365/201; 365/185.22
(58) Field of Classification Search ............. 365/187.07, 365/201, 185.22, 185.14, 226, 189.09, 185.21, 365/210, 185.18, 185.19, 185.2
See application file for complete search history.

(56) References Cited

U.S. PATENT DOCUMENTS

| | | | |
|---|---|---|---|
| 6,094,735 A * | 7/2000 | Cole et al. ................. 714/724 |
| 7,260,057 B2 * | 8/2007 | Toyoshima et al. .......... 370/211 |
| 7,796,446 B2 * | 9/2010 | Ruckerbauer et al. ... 365/189.05 |
| 7,936,812 B2 * | 5/2011 | Hollis ....................... 375/233 |
| 2003/0081479 A1 | 5/2003 | Matsumoto et al. |
| 2006/0233012 A1* | 10/2006 | Sekiguchi et al. ............ 365/51 |
| 2008/0091994 A1* | 4/2008 | Dean et al. ................. 714/724 |

FOREIGN PATENT DOCUMENTS

| KR | 2001-0063184 | 7/2001 |
| KR | 2007-0038255 | 4/2007 |
| KR | 2008-0033671 | 4/2008 |

* cited by examiner

*Primary Examiner* — Dang Nguyen
(74) *Attorney, Agent, or Firm* — Muir Patent Consulting, PLLC

(57) ABSTRACT

A semiconductor memory device includes a plurality of chips, a data path that is physically shared by the plurality of chips, a data input/output pad, and a data output driver. The data output driver is configured to receive merged data that includes data merged from a set of chip data read from the plurality of chips, compare the merged data to first reference data in a test mode, compare the merged data to second reference data in a test mode, and based on the comparisons, apply an output voltage at a data input/output pad.

23 Claims, 7 Drawing Sheets

| MDTA | XCOM1 | XCOM2 | DQ(=ODTA) |
|---|---|---|---|
| DATA 1 PASS (VDD) | 0 | 0 | 1 |
| FAIL | 1 | 0 | High Z |
| DATA 0 PASS (Vss) | 1 | 1 | 0 |

| DQ | ATE |
|---|---|
| 1 | 1 (VDQ > Voh) |
| High Z | FAIL (VDQ = Vt) |
| 0 | 0 (VDQ < Vol) |

SEMICONDUCTOR MEMORY DEVICE HAVING PHYSICALLY SHARED DATA PATH AND TEST DEVICE FOR THE SAME

CROSS-REFERENCE TO RELATED APPLICATIONS

This application claims the benefit of Korean Patent Application No. 10-2009-0051950, filed on Jun. 11, 2009, in the Korean Intellectual Property Office, the disclosure of which is incorporated herein in its entirety by reference.

BACKGROUND

This application relates to a semiconductor memory device, and more particularly, to a semiconductor memory device having a physically shared data path, and a test device for the same.

State of the art semiconductor memory devices can include a stacked set of chips that are accessed by a controller or other external device via a shared data path. For example, a stacked chip semiconductor package may include a plurality of chips stacked vertically, where similar elements of different chips are physically and electrically connected via a shared data path using, for example, a through silicon via (TSV) or a common node on a substrate. Typically, in a semiconductor memory device having a physically shared data path among a set of chips, testing of data written to the chips via the shared data path is accomplished by sequentially accessing and testing each chip, and cannot be simultaneously performed by the chips. Such a method may, however, increase the amount of time needed to test these types of semiconductor devices, thereby slowing down the manufacturing process.

SUMMARY

In one embodiment, a semiconductor memory device is disclosed. The semiconductor memory device includes a plurality of chips, a data path that is physically shared by the plurality of chips, a data input/output pad, and a data output driver. The data output driver is configured to receive merged data that includes data merged from a set of chip data read from the plurality of chips, compare the merged data to first reference data in a test mode, compare the merged data to second reference data in a test mode, and based on the comparisons, apply an output voltage at a data input/output pad.

In another embodiment, a circuit for testing a semiconductor device that includes a plurality of chips having at least one shared data path between the plurality of chips is disclosed. The circuit includes a comparison unit configured to receive merged test data received from the shared data path, perform a comparison of the merged test data to other data, and output at least one comparison data. The circuit further includes an output unit configured to output one of a high voltage, a low voltage, or a high impedance, based at least in part on the at least one comparison data. The circuit additionally includes a test comparator configured to determine whether, based on the output from the output unit, a simultaneous test of the plurality of chips passes.

In a further embodiment, method for simultaneously testing a plurality of semiconductor memory chips of a semiconductor memory device is disclosed. The method includes providing merged test data at a shared data path between the plurality of chips, the merged test data including test data from each of the plurality of chips. The method further includes transmitting the merged test data to a first circuit, performing at least one comparison of the merged test data to other data, and outputting from the first circuit a resulting value based on the comparison. The outputted resulting value permits a tester to determine whether a simultaneous test of the plurality of chips passes or fails.

BRIEF DESCRIPTION OF THE DRAWINGS

Exemplary embodiments will be more clearly understood from the following detailed description taken in conjunction with the accompanying drawings in which.

Figure 1:
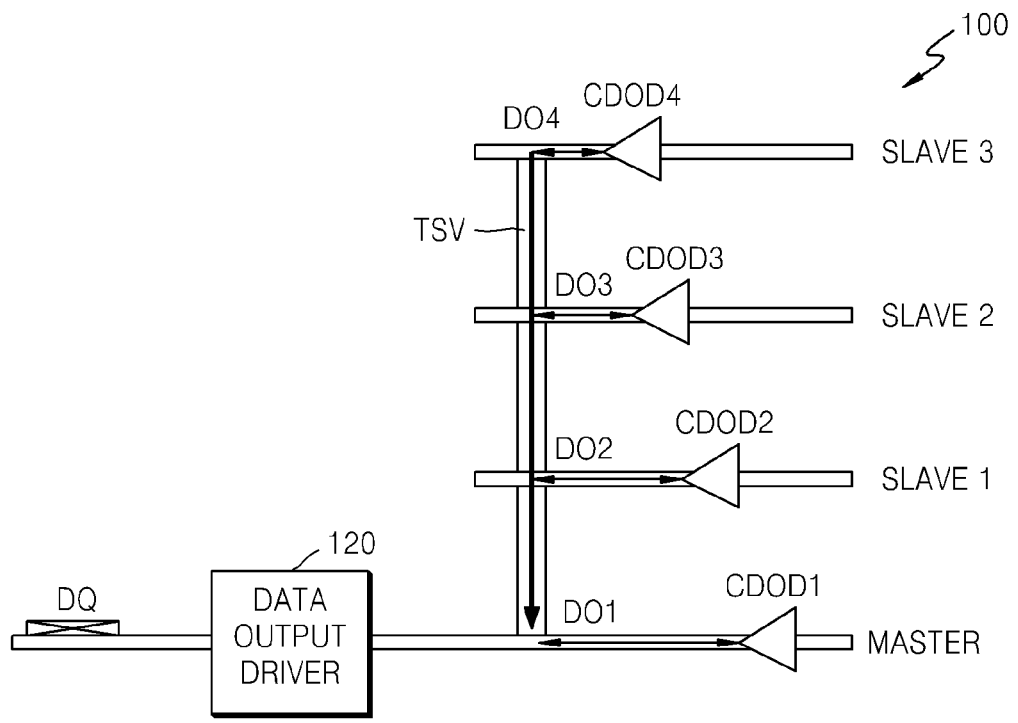
FIG. 1 is a diagram of an exemplary semiconductor memory device according to one embodiment.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative size and positioning components and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, unless noted otherwise, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram of an exemplary semiconductor memory device 100 according to one embodiment. Referring to FIG. 1, an exemplary semiconductor memory device 100 is shown, having a data path that is physically shared by a plurality of chips. In particular, FIG. 1 illustrates a case where the semiconductor memory device 100 is formed in a stack structure in which a plurality of chips is stacked. In the semiconductor memory device 100 formed in the stack structure in which four chips are stacked, one of the four chips may be a master chip (Master) and the others may be slave chips (slaves 1, 2 and 3) (the stack structure is illustrated as an embodiment). Although a stack of memory chips is shown, the embodiments described below are applicable to any stacked or multi-semiconductor device architecture where portions of each device are physically and electrically connected.

The master chip and slave chips 1, 2 and 3 may include chip data output drivers CDOD1, CDOD2, CDOD3 and CDOD4 outputting four pieces of chip data DO1, DO2, DO3 and DO4, respectively. In one embodiment, the master chip and slave chips 1, 2 and 3 may be electrically connected through a common node. For example, the chips may be connected through a via that vertically passes through the master chip and slave chips 1, 2 and 3. That is, the data path may be physically shared by the via, which vertically passes through the master chip and slave chips 1, 2 and 3. Alternatively, the chips may be connected via wire bonds to a common node (e.g., a solder ball) on a substrate.

A method in which a via is formed to vertically pass through a rear surface of a pad of a wafer or a rear surface of a pad of a die so as to electrically connect chips is referred to as a through silicon via (TSV) package method. Using the TSV package method, the area and height of a package may be reduced, and thus the layout area of a semiconductor memory device may be reduced, thereby obtaining high integration density. Although the use of a TSV is described in greater detail below, the embodiments described below can also apply to other common nodes, such as a solder ball connected via wire bonds to each of a plurality of chips.

By using the TSV package method, the semiconductor memory device 100 includes a data path transferring output of the chip data output drivers CDOD1, CDOD2, CDOD3 and CDOD4 to a data input/output pad DQ.

Testing may be performed on the chips of the semiconductor memory device 100. For example, a test pattern including test data (e.g., four pieces of test data—one piece per chip) could be simultaneously written to the chips (e.g., via input/output pad DQ). Subsequently, the stored test patterns could be read out (e.g., via chip data output drivers CDOD1, CDOD2, CDOD3, and CDOD4) and verified to ensure that they were written and stored correctly. In one embodiment, for example, four pieces of chip test data DO1, DO2, DO3 and DO4 to be written to the master chip and slave chips 1, 2 and 3 may be selected such that each has the same value. As such, a test pattern could be used that writes the bit value "1" (e.g., high voltage level) to a memory cell in each of the chips, or alternatively that writes the bit value "0" (e.g., low voltage level) to a memory cell in each of the chips.

A semiconductor memory device including a stack structure formed using the TSV package method has a data path that is shared by chips. Using conventional testing methods, the chips cannot be simultaneously tested. Instead, the chips would be denoted by respective identifiers, and then data would be sequentially read with respect to the respective identifiers so as to test the respective chips.

However, testing the chips sequentially increases the time and cost taken to test the chips. Accordingly, a semiconductor memory device 100 according to the disclosed embodiments includes a structure for reducing time and cost taken to test chips, and for performing test operations on the chips.

Referring again to FIG. 1, in one embodiment, the semiconductor memory device 100 includes the master chip and slave chips 1, 2 and 3, and also a data output driver 120. However, the data output driver could be external to the semiconductor memory device 100, such as for example, part of testing equipment. For convenience of description, data paths associated with the semiconductor memory device 100 are depicted as illustrated in FIG. 2.

Figure 2:
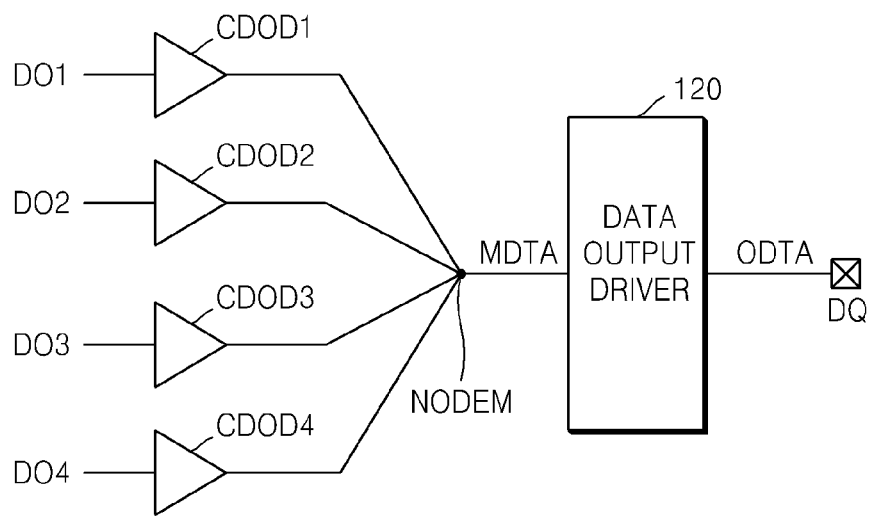
FIG. 2 is a diagram explaining an exemplary case where four pieces of chip data are merged, according to one embodiment.

Referring to FIG. 2, the chip data output drivers CDOD1, CDOD2, CDOD3 and CDOD4 of the chips are depicted as respective buffers. Each buffer receives an input, and outputs the respective data DO1, DO2, DO3, and DO4, which is merged through an electrical connection to a common node NODEM. At NODEM, a voltage corresponding to merged data MDTA in which the four pieces of chip data DO1, DO2, DO3 and DO4 are merged is applied to the data output driver 120, which outputs data ODTA to data input/output pad DQ. In one embodiment, NODEM is a TSV connected to all four output drivers, and MDTA is the voltage level at the TSV.

FIG. 2 depicts an exemplary case where four pieces of chip data are merged, according to one embodiment. However, the disclosed embodiments are not limited to those shown in FIG. 2. In a semiconductor memory device according to the disclosed embodiments, a plurality of pieces of chip data such as two, eight or sixteen pieces of chip data may be merged.

Figure 3A:
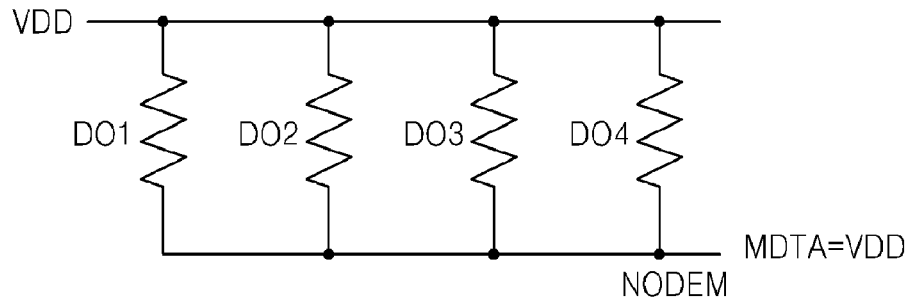
FIGS. 3A through 3C are exemplary circuit diagrams for respectively explaining a voltage of a merged node, according to one embodiment.
Figure 3B:
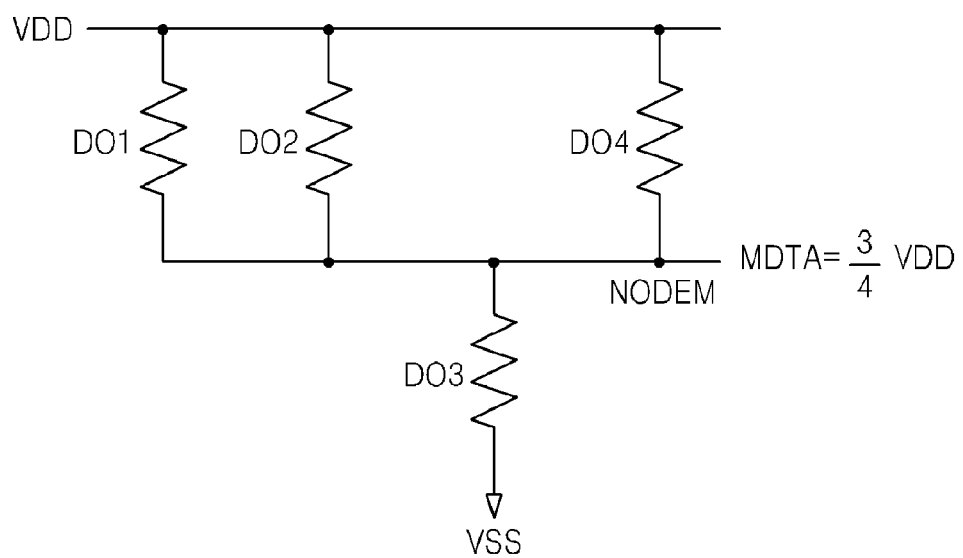
Figure 3C:
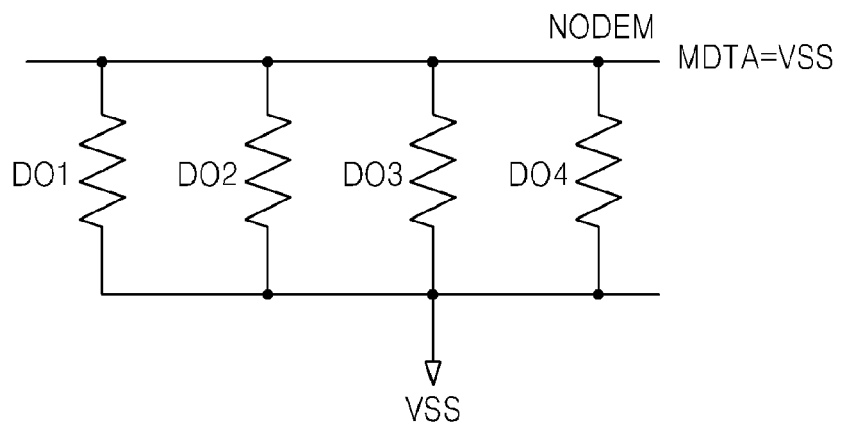

As illustrated in FIGS. 3A through 3C, the merged data MDTA may be denoted by a voltage of a merge node NODEM. In addition, because the electrical paths for transferring the chip data DO1, DO2, DO3, and DO4 include some amount of resistance, the paths over which chip data DO1, DO2, DO3, and DO4 traverse effectively comprise resistors. Therefore, the paths can be modeled as small resistors, having in one embodiment, the same value for each chip data path. As such, the voltage at NODEM will depend on whether the data in each of DO1 through DO4 is a "1" (e.g., high voltage level or VDD) or a "0" (e.g., low voltage level or VSS).

For example, FIG. 3A illustrates a case where each of the four pieces of chip data DO1, DO2, DO3 and DO4 has a value "1" (e.g., a logical value of "1" corresponding to a high voltage state). In FIG. 3A, the four pieces of chip data DO1, DO2, DO3 and DO4 may be depicted as traversing four resistor paths each having a resistance value "R" (e.g., a small resistance value) and connected in parallel between a power voltage VDD and the merge node NODEM. Thus, when each of the four pieces of chip data DO1, DO2, DO3 and DO4 has a logical value of "1", the merge node NODEM has a voltage level effectively corresponding to the power voltage VDD, with perhaps a very minute variation due to the connection resistance. As such, the merge data MDTA may be denoted by the power voltage VDD.

On the other hand, as illustrated in FIG. 3B, when each of first chip data DO1, second chip data DO2, and fourth chip data DO4 has a logical value of "1", and third chip data DO3 has a logical value of "0" (e.g., low voltage state), the first, second and fourth chip data DO1, DO2 and DO4 each having a logical value of "1" may be depicted as traversing three resistor paths with a resistance value "R" connected in parallel between the power voltage VDD and the merge node NODEM, and the third chip data DO3 may be depicted as traversing a resistor with a resistance value "R" connected between the merge node NODEM and a ground voltage VSS. Thus, in FIG. 3B, the merge node NODEM may have a voltage level corresponding to $3/4^{th}$ of the power voltage VDD, and the merge data MDTA may be denoted by a voltage corresponding to $3/4^{th}$ of the power voltage VDD.

FIG. 3C illustrates a case where each of the four pieces of chip data DO1, DO2, DO3 and DO4 has a logical value of "0". In FIG. 3C, the four pieces of chip data DO1, DO2, DO3 and DO4 may be depicted as traversing four resistor paths, each having a resistance value "R" and connected in parallel between the merge node NODEM and the ground voltage VSS. Accordingly, when each of the four pieces of chip data DO1, DO2, DO3 and DO4 has a logical value of "0", the merge node NODEM may have a voltage level effectively corresponding to the ground voltage VSS, and the merged data MDTA may be denoted by the ground voltage VSS.

If the four pieces of chip data DO1, DO2, DO3 and DO4 are written in the chips to have the same value in a test mode, when the four pieces of chip data DO1, DO2, DO3 and DO4 are determined when read to have the same value, a test result may be 'pass.' On the other hand, when the four pieces of chip data are written in the chips to have the same value, but at least one of the group consisting of the four pieces of chip data DO1, DO2, DO3 and DO4 is determined when read as having a different value, as illustrated in FIG. 3B, the test result may be 'fail'. This is described in more detail below.

Figure 4:
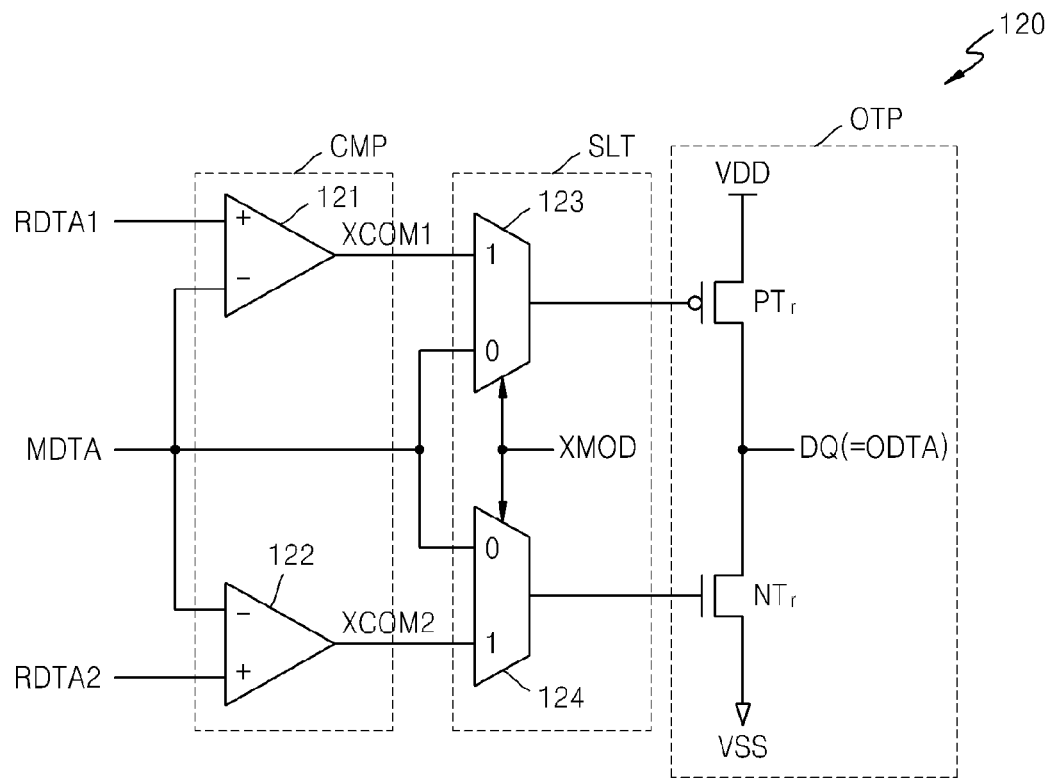
FIG. 4 is an exemplary circuit diagram of a data output driver of FIG. 2, according to one embodiment.

FIG. 4 is a detailed circuit diagram of an exemplary data output driver 120 of FIG. 2, according to one embodiment.

Referring to FIG. 4, in one embodiment, the data output driver 120 includes a comparison unit CMP, a selection unit SLT, and an output unit OTP.

The comparison unit CMP compares first reference data RDTA1 and second reference data RDTA2 to the merge data MDTA denoted by the above-described voltage level, in a test mode. In detail, the comparison unit CMP includes a first comparator 121 comparing the first reference data RDTA1 to the merge data MDTA and generating a first comparison signal XCOM1, and a second comparator 122 comparing the second reference data RDTA2 to the merge data MDTA and generating a second comparison signal XCOM2.

Figure 5:
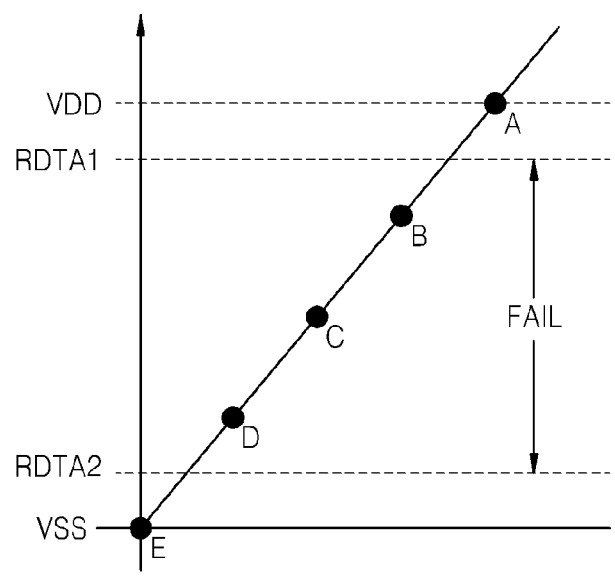
FIG. 5 is an exemplary graph for explaining first reference data and second reference data, consistent with certain disclosed embodiments.

As shown in FIG. 5, the first reference data RDTA1 may be selected to have a voltage level between the voltage level of the merge data MDTA corresponding to a case where each of the four pieces of chip data DO1, DO2, DO3 and DO4 has a logical value "1", and that of the merge data MDTA corresponding to a case where only one of the group consisting of the four pieces of chip data DO1, DO2, DO3 and DO4 has a logical value "0" and the remainder have a logical value "1". For example, if the four pieces of chip data DO1, DO2, DO3 and DO4 of the semiconductor memory device 100 are equivalently converted as illustrated in FIGS. 3A through 3C, the first reference data RDTA1 may be set to a voltage corresponding to $7/8^{th}$ of the power voltage VDD between a voltage level A corresponding to the power voltage VDD and a voltage level B corresponding to $3/4^{th}$ of the power voltage VDD.

As illustrated in FIG. 5, the second reference data RDTA2 may be selected to have a voltage level between the voltage level of the merge data MDTA corresponding to a case where only one of the group consisting of the four pieces of chip data DO1, DO2, DO3 and DO4 has a logical value "1" and the others each have a logical value "0", and that of the merge data MDTA corresponding to a case where each of the four pieces of chip data DO1, DO2, DO3 and DO4 has a logical value "0". For example, when the four pieces of chip data DO1, DO2, DO3 and DO4 of the semiconductor memory device 100 are equivalently converted as illustrated in FIGS. 3A through 3C, the second reference data RDTA2 may be set to a voltage corresponding to $1/8^{th}$ of the power voltage VDD between a voltage level D corresponding to $1/4^{th}$ of the power voltage VDD and a voltage level E corresponding to the ground voltage VSS.

Referring back to FIG. 4, the first comparator 121 may output the first comparison signal XCOM1 having a logic level corresponding to "0" when the merge data MDTA is greater than the first reference data RDTA1, and may output the first comparison signal XCOM1 having a logic level corresponding to "1" when the merge data MDTA is less than the first reference data RDTA1. Likewise, the second comparator 122 may output the second comparison signal XCOM2 having a logic level corresponding to "0" when the merge data MDTA is greater than the second reference data RDTA2, and may output the second comparison signal XCOM2 having a logic level corresponding to "1" when the merge data MDTA is less than the second reference data RDTA2.

In one embodiment, a point in time when logic of the second comparison signal XCOM2 is transited from logic value "1" (i.e., high "H") to logic value "0" (i.e., low "L") or vice versa is different from that of the first comparison signal XCOM1, thereby preventing overcurrent from being generated, wherein an overcurrent may be generated when a PMOS transistor PTr and a NMOS transistor NTr of the output unit OTP, are simultaneously turned on. This will be described further with reference to FIG. 10.

The selection unit SLT may include a first selector 123 and a second selector 124, each of which selects one of the group consisting of the first and second comparison signals XCOM1 and XCOM2, and the merge data MDTA, in response to a mode signal XMOD. The mode signal XMOD may be a signal indicating whether the current mode is a test mode. For example, in one embodiment, when the current mode is a test mode, the mode signal XMOD has a logic level corresponding to "1", and may be applied to the first selector 123 and the second selector 124.

When test mode is selected, the first selector 123 selects the first comparison signal XCOM1 output from the first comparator 121, and transmits the first comparison signal XCOM1 to the output unit OTP. Likewise, the second selector 124 selects the second comparison signal XCOM2 output from the second comparator 122, and transmits the second comparison signal XCOM2 to the output unit OTP. In one embodiment, the first selector 123 and the second selector 124 may each be embodied as a multiplexer.

On the other hand, when the mode is a normal mode, instead of the test mode, the first selector 123 and the second selector 124 transmit the merge data MDTA to the output unit OTP.

The output unit OTP generates output data ODTA corresponding to the first comparison signal XCOM1 and the second comparison signal XCOM2, selected by the selection unit SLT in the test mode, or the merge data MDTA, selected by the selection unit SLT in the normal mode, and applies the output data ODTA to the data input/output pad DQ. In one embodiment, the output unit OTP includes the PMOS transistor PTr and the NMOS transistor NTr, which are connected in series between the power voltage VDD and the ground voltage VSS, as illustrated in FIG. 4. The data input/output pad DQ may be connected to one end of the PMOS transistor PTr and one end of the NMOS transistor NTr that is connected to the PMOS transistor PTr.

In the test mode, the PMOS transistor PTr is gated by the first comparison signal XCOM1. In addition, the NMOS transistor NTr is gated by the second comparison signal XCOM2. On the other hand, in the normal mode, the PMOS transistor PTr and the NMOS transistor NTr are both gated by the merge data MDTA.

As described above, in the test mode, test data input to the semiconductor memory device 100 may be written to have the same value in each chip. Thus, when pieces of chip data are later read to have the same value, it may be determined a test result is 'pass'. As described below, the first comparison signal XCOM1 and the second comparison signal XCOM2 may be used to determine, without reading data from each chip individually, whether the correct test data has been written to and stored in each chip.

In detail, when the pieces of data have the same logic value "1", corresponding, for example, to a "high" voltage of power source VDD, the merge data MDTA has a voltage level corresponding to the power voltage VDD. Thus, because the merge data MDTA is greater than both the first reference data RDTA1 and the second reference data RDTA2, the first comparison signal XCOM1 and the second comparison signal XCOM2 are each generated having a logic level corresponding to "0". Thus, the PMOS transistor PTr is turned on, and the NMOS transistor NTr is turned off. As a result, the output data ODTA is generated as the power voltage VDD or logic "1".

On the other hand, when all of the pieces of chip data have logic value "0", corresponding, for example to a "low" or "ground" voltage, the merge data MDTA has a voltage level corresponding to the ground voltage VSS. Thus, because the merge data MDTA is less than both the first reference data RDTA1 and the second reference data RDTA2, the first comparison signal XCOM1 and the second comparison signal XCOM2 are each generated having a logic level corresponding to "1". Thus, the PMOS transistor PTr is turned off, and the NMOS transistor NTr is turned on. As a result, the output data ODTA is generated as the ground voltage VSS or logic "0".

In a third instance, when at least one of the pieces of data has a different value from the others, it may be determined that the test result is 'fail'. For example, because the merge data MDTA is less than the first reference data RDTA1 and is greater than the second reference data RDTA2, the first comparison signal XCOM1 is generated having a logic level corresponding to "1", and the second comparison signal XCOM2 is generated having a logic level corresponding to "0". Thus, both of the PMOS transistor PTr and the NMOS transistor NTr are turned off. As a result, the data input/output pad DQ is in a floating, high-impedance state.

Figures 6, 7:
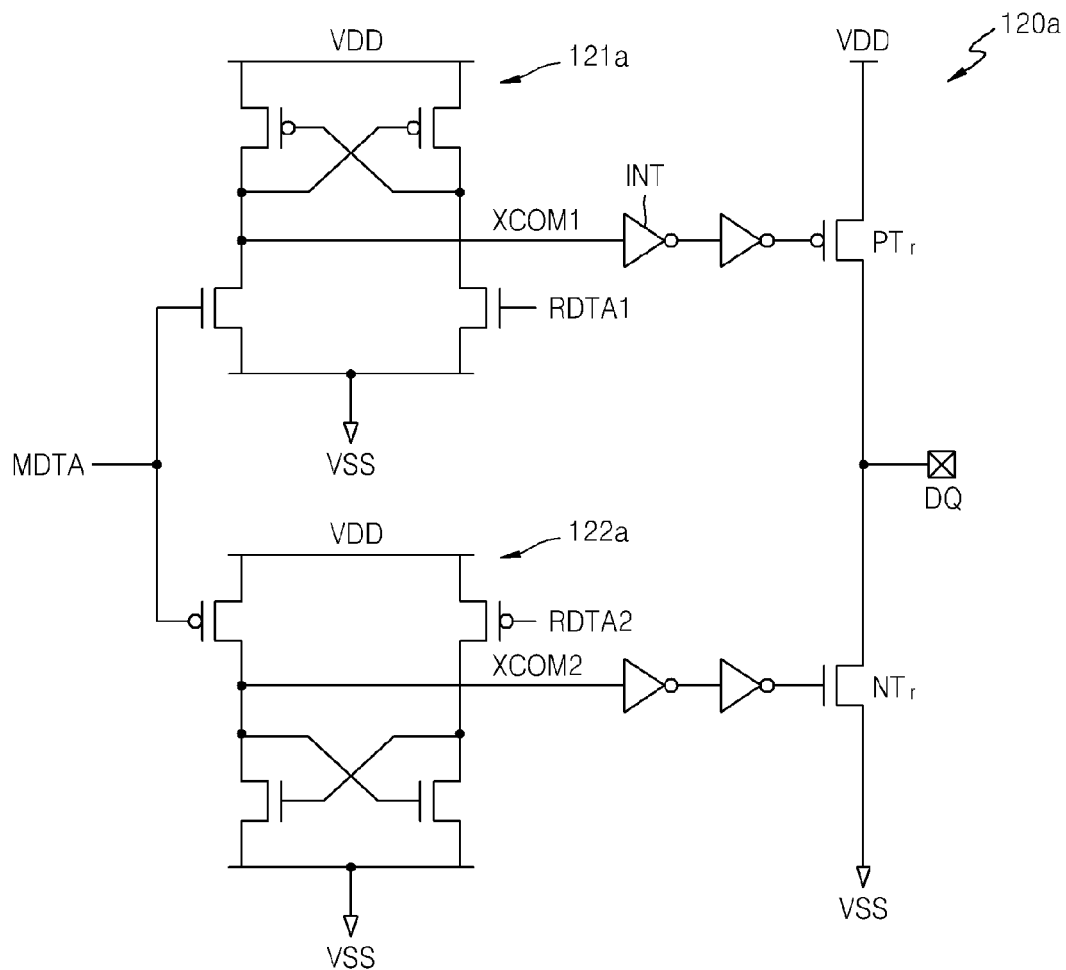
FIG. 6 is a table showing exemplary states of an output of a data output driver, according to one embodiment.
FIG. 7 is an exemplary circuit diagram of a data output driver, according to another embodiment.

FIG. 6 is a table showing exemplary states of the output of the data output driver 120, according to one embodiment. For example, where test data is all "1"s, the portion of a device being tested (e.g., a set of corresponding memory cells on each chip) passes the test if DQ is a "1". Similarly, if the test data is all "0"s, then the portion of the device being tested passes the test if DQ is a "0". However, if DQ is a high impedance, rather than a "1" or a "0", then the device fails.

A semiconductor memory device according to the disclosed embodiments has a data path shared by a plurality of chips, and data may be simultaneously written to and tested with respect to the chips, such that a tester can determine whether all corresponding portions (e.g., memory cells) of respective chips pass, without testing the chips individually. Thus, the semiconductor memory device can reduce the time and cost taken to test the chips.

FIG. 7 depicts an alternative embodiment, in which the first comparator 121 and the second comparator 122 of FIG. 4 may each be embodied as a differential amplifier. In order to control, for example, latency, an inverter INT may be inserted between the first differential amplifier 121a and the PMOS transistor Ptr and between the second differential amplifier 122a and the NMOS transistor Ntr. In a data output driver 120a of FIG. 7, for convenience of description, the selection unit SLT of FIG. 4 is not illustrated, though the output unit OTP is shown.

Figures 8, 9:
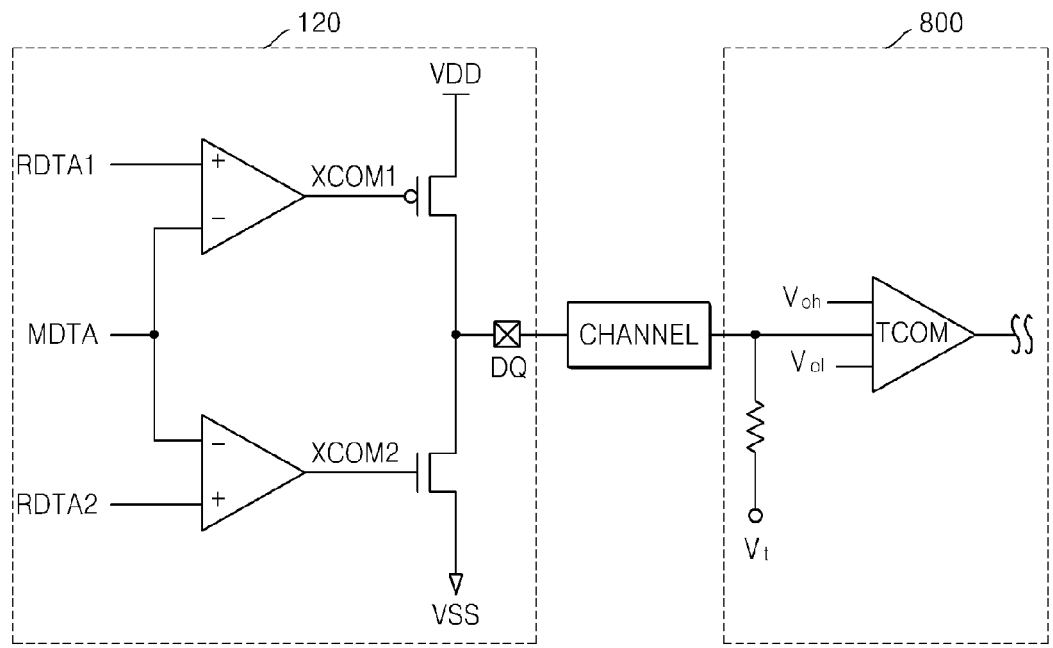
FIG. 8 is a diagram for explaining an exemplary test device ATE for testing the semiconductor memory device, according to one embodiment.
FIG. 9 is a table showing an exemplary sensing state of a test comparator of FIG. 8, according to one embodiment.

FIG. 8 is a diagram for explaining an exemplary test device ATE 800 for testing the semiconductor memory device 100 of FIG. 1, according to one embodiment.

Referring to FIG. 8, the data input/output pad DQ of the semiconductor device 100 and the test device ATE 800 are connected by a channel (e.g., an electrical connection). For convenience of description, only the data output driver 120 of the semiconductor memory device 100 is illustrated in FIG. 8. Note, however, that the data output driver need not be part of the semiconductor device 100, but could alternatively be part of, for example, test equipment that connects to VDD, VSS, MDTA, and DQ associated with the semiconductor device 100. Similarly, test device 800 could be part of the semiconductor device 100 or can be a separate device. Since the configuration and operation of the data output driver 120 of FIG. 8 are the same as those in FIG. 4, details regarding the data output driver 120 will not be repeated. FIG. 8 depicts a case where the semiconductor memory device 100 operates in a test mode.

As described above, the data input/output pad DQ of the semiconductor memory device 100 has a voltage corresponding to "1" or "0", or is in a high-impedance state.

The test device ATE 800 includes a test comparator TCOM sensing data written from a data input/output pad voltage VDQ of the data input/output pad DQ. The test comparator TCOM compares the output of the data input/output pad DQ to a test high voltage Voh, a test low voltage Vol, and a test termination voltage Vt. An example of this is shown in a table of FIG. 9.

Referring to FIGS. 8 and 9, the test comparator TCOM determines that the data written from the semiconductor memory device 100 is "1" when the data input/output pad voltage VDQ is higher than the test high voltage Voh. In addition, the test comparer TCOM determines that the data written from the semiconductor memory device 100 is "0" when the data input/output pad voltage VDQ is lower than the test low voltage Vol. In one embodiment, the test high voltage Voh and test low voltage Vol are selected to be close to the voltage VDD and VSS (e.g., ⅞ VDD or ⅛ VDD where VSS is ground).

When the data input/output pad DQ is in a high-impedance state, the data input/output pad DQ has the test termination voltage Vt, and a test result related to corresponding data is determined as 'fail'. The test device ATE according to the present embodiment may include a terminal resistor Rt connected to the semiconductor memory device 100 through a channel in order to match the high-impedance state of the data input/output pad DQ.

Figure 10:
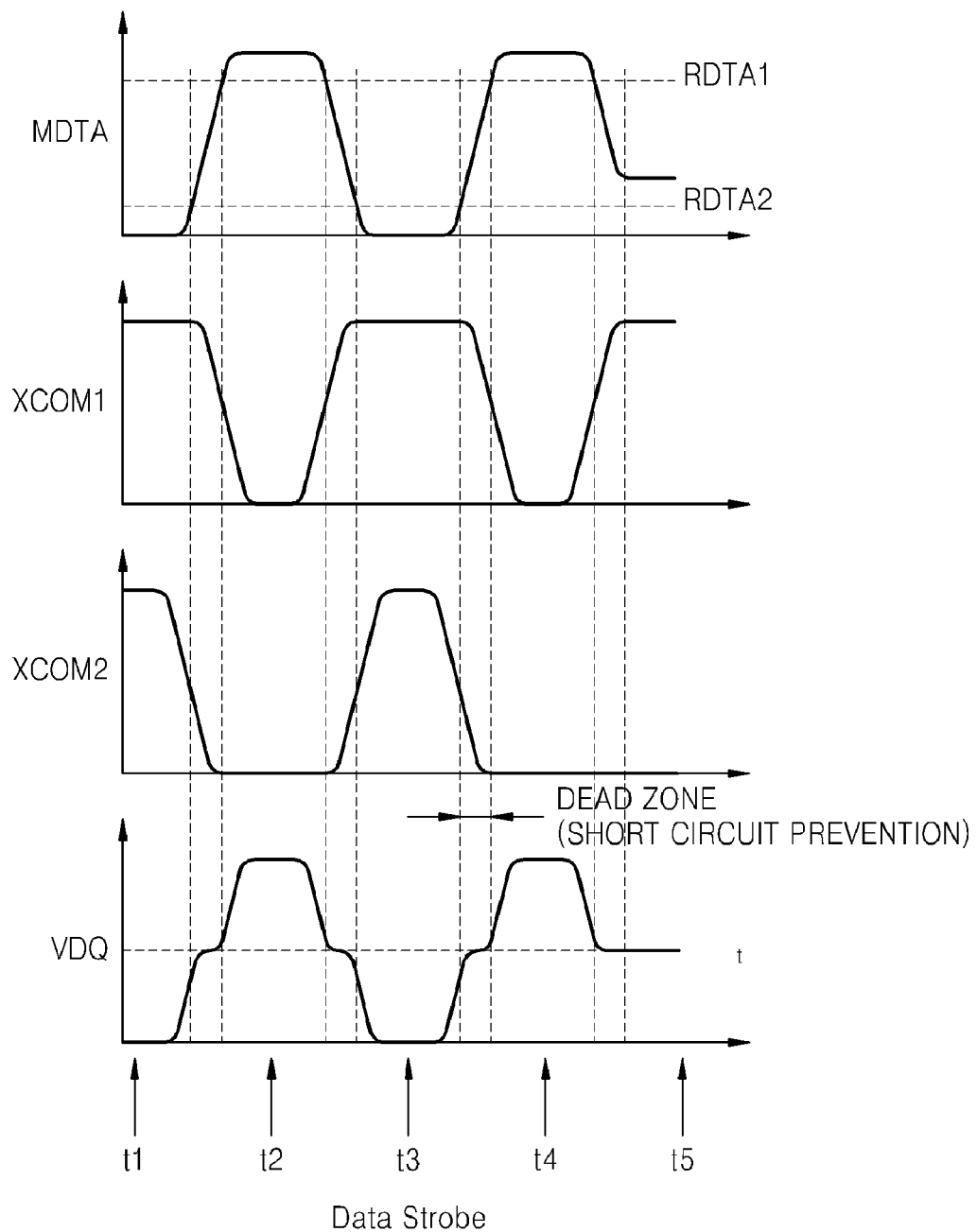
FIG. 10 shows exemplary graphs for explaining a voltage applied to a test device from a semiconductor memory device, consistent with certain disclosed embodiments.

FIG. 10 shows graphs for explaining a voltage applied to the test device ATE of FIG. 8 from the semiconductor memory device 100.

Referring to FIGS. 8 and 10, in one embodiment, the data output driver 120 of the semiconductor memory device 100 compares the first reference data RDTA1 and the second reference data RDTA2 to the merge data MDTA, and generates comparison results, i.e., the first comparison signal XCOM1 and the second comparison signal XCOM2. As described above, a point of time when logic of the second comparison signal XCOM2 is transited may be differently set from that of the first comparison signal XCOM1, thereby preventing overcurrent from being generated, wherein the overcurrent would be generated when the PMOS transistor PTr and the NMOS transistor NTr of the data output driver 120 are simultaneously turned on.

As described above, the data input/output pad voltage VDQ of FIG. 10 is applied to the test device ATE of FIG. 8. FIG. 10 illustrates a case where the test device ATE of FIG. 8 senses data written from the semiconductor memory device 100 for a period of time from t1 to t5.

Figure 11:
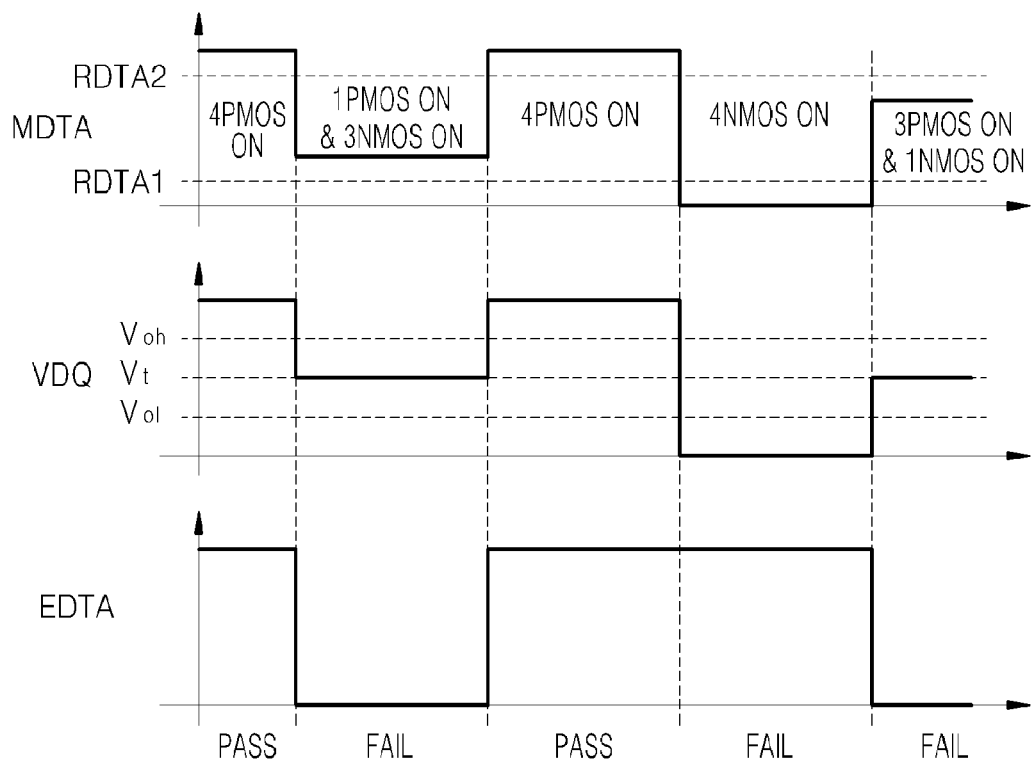
FIG. 11 shows an exemplary test result of data sensed at different points in time, according to one embodiment.

FIG. 11 shows an exemplary test result of data sensed at different points in time, according to one embodiment. The output data ODTA is output to the data input/output pad DQ, and is compared to expectation data EDTA corresponding to test data that is input to the semiconductor memory device 100 in order to perform a test.

The merge data MDTA is formed according to a combination of on and off of the PMOS transistors or the NMOS transistors of the four chip data output drivers CDOD1, CDOD2, CDOD3 and CDOD4 FIG. 1. For example, when all of the PMOS transistors of the four chip data output drivers CDOD1, CDOD2, CDOD3 and CDOD4 are turned on, and all of the NMOS transistors of the four chip data output drivers CDOD1, CDOD2, CDOD3 and CDOD4 are turned off, the merge data MDTA is formed as a voltage corresponding to a power voltage level. On the other hand, when the NMOS transistors of the four chip data output drivers CDOD1, CDOD2, CDOD3 and CDOD4 are turned on, and the PMOS transistors of the four chip data output drivers CDOD1, CDOD2, CDOD3 and CDOD4 are turned off, the merge data MDTA is formed as a voltage corresponding to a VSS or ground voltage level. In addition, when some of the PMOS transistors of the four chip data output drivers CDOD1, CDOD2, CDOD3 and CDOD4 are turned on, or when some of the NMOS transistors are turned on, the merge data MDTA is formed as a voltage having a level between the power voltage and the ground voltage.

The data output driver 120 compares the merge data MDTA to the first reference data RDTA1 and the second reference data RDTA2, and thus the output data ODTA is formed according to a comparison result. The data output driver 120 of FIG. 4 applies a voltage corresponding to the output data ODTA to the data input/output pad DQ.

The operations of forming the merge data MDTA and of applying a voltage to the data input/output pad DQ have been described above with reference to FIGS. 3 and 4.

The test device 800 of FIG. 8 compares the voltage VDQ of the data input/output pad DQ applied through a channel to the test high voltage Voh, the test low voltage Vol and the test terminal voltage Vt. A structure and operation of the test device 800 of FIG. 8 has been described above.

When the voltage VDQ of the data input/output pad DQ, which is sensed by the test device 800 of FIG. 8, is shown as in FIG. 11, the test device 800 may sense output data of the semiconductor memory device 100 with respect to points of time t1 to t5 as "1", "X", "1", "0" and "X", respectively. "X" indicates a case where a data value is neither "1" nor "0," such as when a high impedance value appears at DQ. For example, as described above, the test device 800 of FIG. 8 may sense the voltage VDQ of the data input/output pad DQ as the terminal voltage Vt, and may determine the memory device to 'Fail' when the voltage VDQ of the data input/output pad DQ is between the test high voltage Voh and the test low voltage Vol.

In one embodiment, if the expectation data EDTA transmitted to the semiconductor memory device in order to test the semiconductor memory device is shown as in FIG. 11, a test device may compare sensed data to the expectation data EDTA, and may sequentially generate test results as "PASS", "FAIL", "PASS", "FAIL" and "FAIL". Thus, where test data of all "1" (e.g., VDD) was generated and written to memory, and a resulting "1" value appears at DQ, or where test data of all "0" (e.g., VSS) was generated and written to memory, and a resulting "0" value appears at DQ, a test result for the element being tested would be "PASS" for that time period. However, if test data of all "1" was generated and a resulting "0" value appears at DQ, or vice versa, or if test data of all "1" or all "0" was generated but a resulting value at DQ is between the values of "0" and "1," then the test result for the element being tested would be "FAIL" for that time period.

In the descriptions above, a semiconductor memory device and a test device thereof where a data path is physically shared by four chips have been described. However, the semiconductor memory device according to the disclosed embodiments and the test device thereof are not limited to any particular case. For example, the data path may be shared by various numbers of chips in the semiconductor memory device and one or more data output drivers may be used for each semiconductor memory device.

Figure 12:
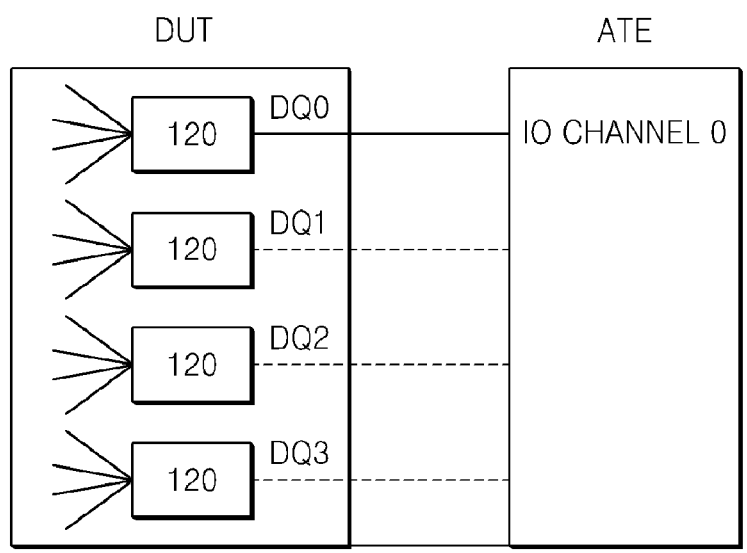
FIG. 12 is an exemplary diagram illustrating a case where a semiconductor memory device having a stack structure, and a test device are used, according to one embodiment.

For example, a semiconductor memory device having a data path shared by four chips or sixteen chips of a multichip package may include a plurality of the data output drivers 120, as depicted in FIG. 12. Each driver may be used to test a predetermined set of elements (e.g., memory cells) on a plurality of semiconductor devices (e.g., chips). Thus testing of the different data paths may operate separately, or simultaneously with respect to the data output drivers 120. Thus, to test one portion of a stack of chips, for example, a test device may activate only an output of one data output driver 120 from among outputs of data output drivers 120 while setting the outputs of the remaining output drivers to be, for example, a high impedance. Alternatively, a test device may activate and test the output of the one data output driver 120 at the same time as the remaining outputs.

Furthermore, the data output driver according to the present embodiment is not limited to only a case where a data path is shared by a plurality of chips. It may also be applied to a plurality of pieces of data with respect to a single chip. That is, the data output driver according to the disclosed embodiments may compare merged data in which a plurality of pieces of data output from a single chip are merged to first reference data and second reference data, and may apply a voltage having a level corresponding to a comparison result to a data input/output pad, in a test mode for testing a such semiconductor memory device. Further, although a stack of chips is described, the disclosed embodiments may apply to any stack of semiconductor devices that are part of a package and share common data paths between the devices.

While various embodiments have been particularly shown and described with reference to the examples discussed above, it will be understood that various changes in form and details may be made therein without departing from the spirit and scope of the following claims.

What is claimed is:

1. A semiconductor memory device, comprising:
 a plurality of chips;
 a data path that is physically shared by the plurality of chips;
 a data input/output pad; and
 a data output driver configured to:
  receive merged data that includes data merged from a set of chip data read from the plurality of chips,
  compare the merged data to first reference data in a test mode,
  compare the merged data to second reference data in a test mode, and
  based on the comparisons, apply an output voltage at a data input/output pad.

2. The semiconductor memory device of claim 1, wherein: each chip of the plurality of chips includes a piece of test data, such that:
 if the test data for each of the plurality of chips has a logical value of "1", the merged data is generated as a value corresponding to a power supply voltage, and if each of the plurality of chip data has a logical value of "0", the merged data is generated as a value corresponding to a ground voltage.

3. The semiconductor memory device of claim 2, wherein: the first reference data is generated as a voltage level between the power supply voltage level and a voltage level of the merged data corresponding to a case where only one of the pieces of test data has a logical value of "0".

4. The semiconductor memory device of claim 2, wherein: the second reference data is generated as a voltage level between the ground voltage level and a voltage level of the merged data corresponding to a case where only one of the pieces of chip data has a logical value of "1".

5. The semiconductor memory device of claim 1, wherein: the data output driver is further configured to receive the merged data from the data path physically shared by the plurality of chips.

6. The semiconductor memory device of claim 1, wherein: each chip of the plurality of chips includes a piece of test data, such that:
 when the data for each of the plurality of chips has a logical value of "1", the merged data is generated as a value corresponding to one of a power supply voltage or a ground voltage, when each of the plurality of chip data has a logical value of "0", the merged data is generated as a value corresponding to the other of the power supply voltage or the ground voltage, and when at least one of the plurality of chip data has a logical value of "0" and at least one of the plurality of chip data has a logical value of "1", the merged data is generated as a value corresponding to a voltage between the power supply voltage and the ground voltage.

7. A semiconductor memory device, comprising:
 a plurality of chips;
 a data path that is physically shared by the plurality of chips;
 a data input/output pad;
 a data output driver configured to:
  receive merged data that includes data merged from a set of chip data read from the plurality of chips,
  compare the merged data to first reference data in a test mode,
  compare the merged data to second reference data in the test mode, and
  based on the comparisons, apply an output voltage at a data input/output pad
 a first comparator configured to compare the merged data to the first reference data when in the test mode;
 a second comparator configured to compare the merged data to the second reference data when in the test mode; and
 a PMOS transistor and an NMOS transistor connected in series between a power supply voltage and a ground voltage, wherein the PMOS transistor is gated to receive a first comparison signal transmitted from the first comparator, and the NMOS transistor is gated to receive a second comparison signal transmitted from the second comparator.

8. The semiconductor memory device of claim 7, wherein the data output driver operates according to a mode signal indicating either a test mode or a normal mode, and further comprising:
 a first selector configured to select and transmit either the first comparison signal or the merged data to a gate of the PMOS transistor; and
 a second selector configured to select and transmit either the second comparison signal or the merged data to a gate of the NMOS transistor.

9. The semiconductor memory device of claim 7, wherein the first comparison signal and the second comparison signal are generated at different points in time.

10. The semiconductor memory device of claim 7, wherein the data input/out pad is located between the PMOS transistor and the NMOS transistor and wherein a test result passes when the data input/output pad has a voltage level corresponding to a voltage applied by one turned-on transistor of either the PMOS transistor or the NMOS transistor when in the test mode.

11. The semiconductor memory device of claim 7, wherein a test result fails when the data input/out pad is in a high-impedance state.

12. The semiconductor memory device of claim 7, wherein when in a normal mode, the data output driver applies a voltage to the PMOS and NMOS transistors corresponding to the merged data.

13. A circuit for testing a semiconductor device that includes a plurality of chips having at least one shared data path between the plurality of chips, the circuit comprising:

a comparison unit configured to receive merged test data received from the shared data path, perform a comparison of the merged test data to other data, and output at least one comparison data;

an output unit configured to output each of a high voltage, a low voltage, and a high impedance, and to output one of the high voltage, the low voltage, or the high impedance based at least in part on the at least one comparison data; and a test comparator configured to determine whether, based on the output from the output unit, a simultaneous test of the plurality of chips passes.

14. The circuit of claim 13, wherein the comparison unit further comprises:

a first comparator configured to compare the merged test data to first reference data when in a test mode; and a second comparator configured to compare the merged data to second reference data when in the test mode, wherein the first reference data is a voltage level between a power supply voltage level and a voltage level that is n/m of the power supply voltage, where m is the number of chips being tested, and n is m−1, and the second reference data is a voltage level between a ground voltage level and a voltage level that is 1/m of the power supply voltage.

15. The circuit of claim 13, wherein the output unit further comprises:

a PMOS transistor having a first end connected to a supply voltage, and a gate connected to receive first comparison data output from a first comparator of the comparison unit;

an NMOS transistor having a first end connected to a ground voltage, and a gate connected to receive second comparison data output from a second comparator of the comparison unit; and a node connected to a second end of the PMOS transistor and a second end of the NMOS transistor.

16. The circuit of claim 13, further comprising:

a data input/output pad that receives the output from the output unit;

a channel connected to the data input/output pad at a first node and the test comparator at a second node; and a terminal resistor connected to the second node, wherein the test comparator compares the voltage at the second node to a high voltage value and a low voltage value to determine whether the simultaneous test of the plurality of chips passes.

17. A method for simultaneously testing a plurality of semiconductor memory chips of a semiconductor memory device, the method comprising:

providing merged test data at a shared data path between the plurality of chips, the merged test data including test data from each of the plurality of chips;

transmitting the merged test data to a first circuit, performing at least one comparison of the merged test data to other data; and outputting from the first circuit a resulting value based on the comparison, wherein the outputted resulting value permits a tester to determine whether a simultaneous test of the plurality of chips passes or fails, and the simultaneous test includes transmission of the test data that comprises the merged test data simultaneously over the shared data path to the first circuit.

18. The method of claim 17, wherein the shared data path includes a through silicon via (TSV).

19. The method of claim 17, further comprising:

forming the merged test data by merging test data from each of the plurality of chips, the test data from each chip having either a logical value of "1" or a logical value of "0";

comparing the merged test data to first reference data and outputting a first comparison result;

comparing the merged test data to a second reference data and outputting a second comparison result; and using the first comparison result and the second comparison result to determine the resulting value output from the first circuit.

20. The method of claim 19, wherein:

the first reference data is a voltage level between a power supply voltage level supplied to the plurality of semiconductor memory chips and a voltage level of the merged data corresponding to a case where the test data from only one of the plurality of chips has a logical value of "0" and the test data from the other of the plurality of chips has a logical value of "1"; and the second reference data is a voltage level between a ground voltage level for the plurality of semiconductor memory chips and a voltage level of the merged data corresponding to a case where the test data from only one of the plurality of chips has a logical value of "1" and the test data from the other of the plurality of chips has a logical value of "0".

21. The method of claim 17, further comprising:

providing additional merged test data at an additional shared data path between the plurality of chips, the additional merged test data including additional test data from each of the plurality of chips; and using a second circuit for testing the additional merged test data, wherein the first circuit is a first output driver and the second circuit is a second output driver, and when the second output driver is activated, the semiconductor memory device sets the output of the first output driver to be in a high-impedance state.

22. The method of claim 17, wherein:

each chip of the plurality of chips includes a piece of test data, such that:

when the test data for each of the plurality of chips has a logical value of "1", the merged test data is generated as a value corresponding to one of a power supply voltage or a ground voltage, when each of the plurality of chip data has a logical value of "0", the merged test data is generated as a value corresponding to the other of the power supply voltage or the ground voltage, and when at least one of the plurality of chip data has a logical value of "0" and at least one of the plurality of chip data has a logical value of "1", the merged test data is generated as a value corresponding to a voltage between the power supply voltage and the ground voltage.

23. A method for simultaneous testing a plurality of semiconductor memory chips of a semiconductor memory device, the method comprising:

providing merged test data at a shared data path between the plurality of chips, the merged test including test data from each of the plurality of chips;

transmitting the merged test data to a first circuit, performing at least one comparison of the merged test data to other data; and outputting from the first circuit a resulting value based on the comparison, wherein the outputted resulting value permits a tester to determine whether a simultaneous test of the plurality of chips passes or fails,
wherein the resulting value is one of a high voltage value, a low voltage value, or a high impedance value, and
wherein the high and low, voltage values each indicate a first test result, and the high impedance value indicates a second, opposite test result.

* * * * *